United States Patent [19]

Maisch et al.

[11] Patent Number: 4,642,602

[45] Date of Patent: Feb. 10, 1987

[54] ELECTRIC POTENTIOMETER

[75] Inventors: Wolfgang Maisch, Schwieberdingen; Jürgen Treiber, Bamberg, both of Fed. Rep. of Germany

[73] Assignee: Robert Bosch GmbH, Stuttgart, Fed. Rep. of Germany

[21] Appl. No.: 728,434

[22] Filed: Apr. 29, 1985

[30] Foreign Application Priority Data

Jul. 3, 1984 [DE] Fed. Rep. of Germany ....... 3424399

Oct. 13, 1984 [DE] Fed. Rep. of Germany ....... 3437609

[51] Int. Cl.[4] ..................... H01L 10/30; H01L 10/32; H01L 10/00; H01L 1/012

[52] U.S. Cl. ..................................... 338/162; 338/68; 338/160; 338/308

[58] Field of Search ................. 338/68, 143, 138, 150, 338/160, 162, 142, 176, 308

[56] References Cited

U.S. PATENT DOCUMENTS 2,786,925 12/1951 Kahan ............................ 338/308 X 3,111,639 11/1963 Ploke ............................ 338/142 X

*Primary Examiner*—Harold Broome

*Assistant Examiner*—Linda M. Peco

*Attorney, Agent, or Firm*—Edwin E. Greigg

[57] ABSTRACT

An electric potentiometer is proposed, which serves to convert a displacement movement into an electrical signal. The electric potentiometer has a wiper lever with brush wipers which upon a rotational movement about a pivot shaft stroke electrically conductive layers applied to a carrier plate. An electrically nonconductive layer is applied on the resistor layer such that in the region of the electrically conductive layer that is strokable by the wiper upon its deflection, a pickup zone which is narrower than the wiper and is defined on both sides by the electrically nonconductive layer remains uncovered by the electrically nonconductive layer.

7 Claims, 2 Drawing Figures

ELECTRIC POTENTIOMETER

BACKGROUND OF THE INVENTION

The invention is based on an electric potentiometer as generally defined hereinafter. An electric potentiometer has already been proposed in which the desired characteristic curve, which characterizes the relationship between the deflection travel of the wiper and the resultant change in voltage, can be attained only by means of an extremely tedious and expensive process of adjusting the brush wiper relative to the middle of the electrically conductive layer.

OBJECT AND SUMMARY OF THE INVENTION

The electric potentiometer according to the invention has the advantage over the prior art that in the course of its deflection movement, the wiper always passes over the electrically conductive layer symmetrically with respect to the center line, in the movement direction, of the conductive layer.

A particularly advantageous feature of the invention, given an electrically conductive layer which increases in width in the direction of wiper deflection, is the provision of a pickup zone the width of which likewise increases in the direction of wiper deflection, beginning at the narrow end of the electrically conductive layer, specifically in such a manner that the parts of the wiper touching the pickup zone in its position near the narrow end of the electrically conductive layer do not touch the electrically nonconductive layer during a deflection of the wiper along the center line of the electrically conductive layer. As a result, falsifications of the characteristic potentiometer curve, which can be caused by roughening or wear of the tiny brush wires of the wiper on the more aggressive electrically nonconductive layer, because of the increase in contact surface area and/or wear, are avoided in the zone of maximum rise in the characteristic curve.

The invention will be better understood and further objects and advantages thereof will become more apparent from the ensuing detailed description of a preferred embodiment taken in conjunction with the drawings.

DESCRIPTION OF THE PREFERRED EMBODIMENTS

Figure 1:
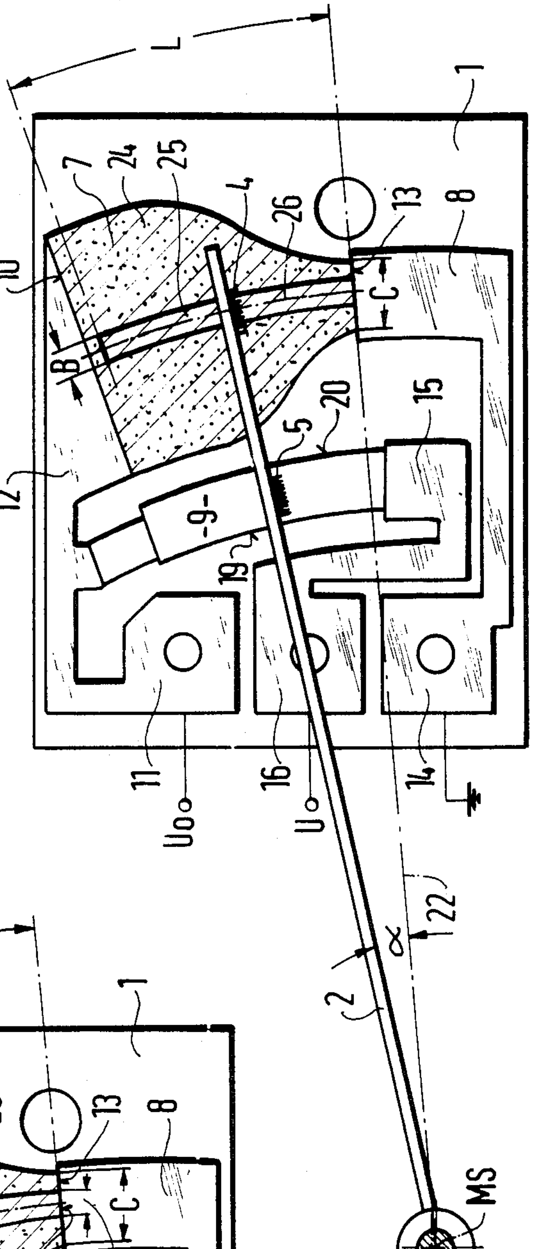
FIG. 1 shows schematically a first exemplary embodiment of a potentiometer according to the invention.

FIG. 1 shows an electric potentiometer which has an electrically nonconductive carrier plate 1, for instance made of ceramic material, and a wiper lever 2. The wiper lever 2 is rotatably supported about a pivot shaft 3 having a center point MS. Upon a rotational movement about the pivot shaft 3, the wiper lever 2 strokes electrically conductive layers 7, 9, which are applied to the carrier plate 1, spaced apart from one another, by known methods. This stroking operation is effected with a wiper 4 and a further wiper 5 disposed in a manner to be axially spaced apart from the wiper 4, these wipers comprise for instance brush wiper means. The first electrically conductive layer 7, shown shaded in the drawing, can be stroked by the brush wiper 4 and is embodied as as resistor layer, which at one end 10 is joined to an electrically conductive connecting layer 12 leading to an electrically conductive terminal connection layer 11 and at its other end 13, which is narrower in embodiment, is joined to an electrically conductive connecting layer 8, which leads to a grounded electrically conductive terminal connection layer 14. The supply voltage $U_o$ is applied to the terminal connection layer 11. The brush wipers 4 and 5 are interconnected in an electrically conductive manner, and the further electrically conductive layer 9 stroked by the brush wiper 5 is joined via an electrically conductive connecting layer 15 to a pickup connection layer 16, at which the measured voltage U may be picked up. If the brush wiper 5 is in the correct position, the wiper 5 travels in a predetermined path which is narrower than the further electrically conductive layer 9, the path of movement on the one hand having a radius somewhat larger than the limiting line 19 oriented toward the pivot shaft 3 and somewhat smaller than that of the limiting line 20, remote from the pivot shaft 3, of the further electric layer 9. The width of the brush wiper 5 in the longitudinal direction of the wiper lever 2 is smaller than the width of the layer 9. In its position of rest, the wiper lever 2 assumes a position which corresponds to the dot-dashed line 22 and passes through the end 13 of the resistor layer 7. The measuring movement direction of the wiper lever 2 in the exemplary embodiment extends counterclockwise in the direction of the angle $\alpha$, the wiper lever stroking the resistor layer 7 with its brush wiper 4 and th layer 9 with its brush wiper 5.

Upon a movement in the direction of the angle $\alpha$, the brush wiper 4 strokes an area of the resistor layer 7 on a movement path. The width of the brush wiper may be smaller in the longitudinal direction of the wiper lever 2 than the width C of the resistor layer 7 at the narrow end 13.

An electrically nonconductive and hence insulating layer 24 is shown in dotted shading in the drawing, being applied on the resistor layer 7 partly such that a pickup zone 25 having a virtually constant width B narrower than the brush wiper 4 in the longitudinal direction of the wiper lever 2 remains uncovered by the electrically nonconductive layer 24 in the vicinity of the movement path of the brush wiper 4 in the direction of the angle $\alpha$ for a length L, this zone 25 thus being defined in the deflection direction by the electrically nonconductive layer 24 on both sides. The pickup zone 25 is embodied symmetrically with the center line 26 of the resistor layer 7, and this center line 26 is arranged to extend in a circular arc about a center point M and being indicated by dot-dash lines. The pickup zone 25 of the resistor layer 7 is fixed in its position exactly in the center of the resistor layer, so that when the brush wiper 4, which is embodied wider than the pickup zone, deflects in the direction of the angle $\alpha$, given center points M and MS for the center line 26 and the wiper 4 ideally located at the same point, it always scans the pickup zone 25 over the same width, while the remaining portions of the brush of the brush wiper 4 which stroke the electrically nonconductive layer 24 to the right and left of the pickup zone may be of different widths, without thereby causing a change in the characteristic curve of a potentiometer during a deflection movement. The electrically nonconductive layer 24 may be wider at the end 13 and narrower at the end 10 than the electrically conductive layer 7, but in any case is wider than the brush wiper 4 in the longitudinal direction of the wiper lever 2.

Figure 2:
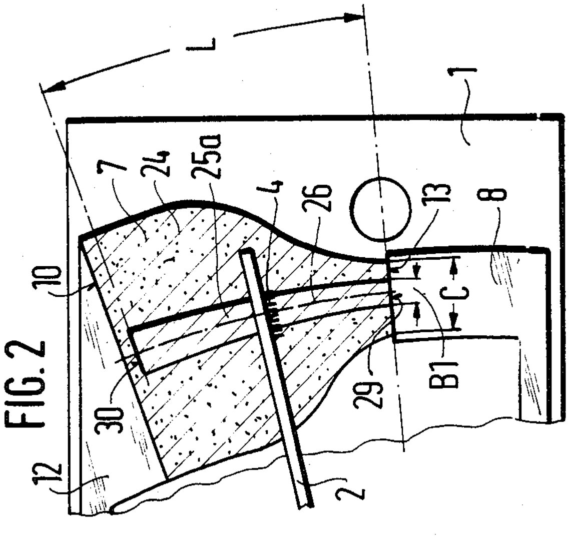
FIG. 2 shows a further schematic view in a second exemplary embodiment of a potentiometer according to the invention, both embodiments being shown in a relatively simplified form.

Since for manufacturing tolerance reasons the positions of the center points M and MS for the center line 26 of the electrically conductive layer 7 and of the brush wiper 4, respectively, do not usually coincide, as is also shown in FIG. 1, there is a danger that upon a rotation of the brush wiper 4 in the direction of the angle $\alpha$, individual brush wires of the brush wiper 4 may successively stroke the electrically conductive layer 7 in the pickup zone 25 and the electrically nonconductive layer 24, thereby becoming roughened or worn down by the more aggressive electrically nonconductive layer 24, so that as a consequence of a larger contact surface area and/or abrasive wear of these brush wires, in particular for measurement positions of the brush wiper 4 near the narrow end 13 of the electrically conductive layer 7, at which the characteristic curve of the potentiometer has it maximum rise, undesirably great falsifications of the characteristic curve will occur. To avoid this kind of error, the pickup zone 25*a* in the second exemplary embodiment shown in FIG. 2, in which elements remaining the same and having the same function as those of FIG. 1 are identified by the same reference numerals, is embodied transverse to the center line 26 of the electrically conductive layer 7 and with a different width B1, specifically such that from its one end 29 at the narrow end 13 of the electrically conductive layer 7 to its other end 30, after a length L, it has a continuously increasing width B1 (see FIG. 2). This means that the pickup zone 25*a* is located with its narrow end 29 in the vicinity of the narrow end 13 of the electrically conductive layer 7, that is, in the area of the greatest rise in the characteristic potentiometer curve, while the wider end 30 of the pickup zone 25*a* is located in the vicinity of the wider end 10 of the electrically conductive layer 7, in which the rise in the characteristic potentiometer curve is flatter. The width B1 of the pickup zone 25*a* which increases from the narrow end 29 on is to be selected such that upon a deflection of the wiper along the center line 26, the brush wires of the wiper 4 which touch the pickup zone 25*a* when the wiper is in its position near the narrow end 29 do not touch the electrically nonconductive layer 24; as a result, the brush wires of the wiper 4 stroking the narrow region of the electrically conductive layer 7 near the end 13, which has the maximum characteristic curve rise and hence is the most vulnerable to errors, remain unaffected by the electrically nonconductive layer 24 at its mechanical contact surfaces, thereby avoiding falsification of the characteristic curve of the potentiometer in its particularly vulnerable range.

The foregoing relates to preferred exemplary embodiments of the invention, it being understood that other variants and embodiments thereof are possible within the spirit and scope of the invention, the latter being defined by the appended claims.

What is claimed and desired to be secured by Letters Patent of the United States is:

1. An electric potentiometer having a carrier plate, a wiper having a predetermined width and an electrically conductive layer having a region to be stroked by said wiper, comprising an electrically nonconductive layer partially applied to said electrically conductive layer a pickup zone on said electrically conductive layer said pickup zone having a width less than said wiper and said pickup zone further having side portions which are defined by said electrically nonconductive layer.

2. An electric potentiometer as defined by claim 1, further wherein said pickup zone further includes a center line which is embodied symmetrically with respect to said electrically conductive layer, said center line further arranged to extend in a circular arc about a center (M) in the deflection direction of said wiper.

3. An electric potentiometer as defined by claim 2, further wherein said picup zone has a length (L) in the deflection direction of said wiper and has a constant width (B) arranged transverse to the center line of the electrically conductive layer.

4. An electric potentiometer as defined by claim 2, further wherein said pickup zone has a length (L) in the deflection direction of said wiper and is embodied with a variable width transverse to said center line of said electrically conductive layer.

5. An electric potentiometer as defined by claim 2, further wherein said pickup zone has a width (B1) which continuously increases from one end to the other end thereof transverse to said center line of said electrically conductive layer.

6. An electric potentiometer as defined by claim 5, further wherein said electrically conductive layer further includes a narrow end zone and an increasing width (C) arranged transverse to the deflection direction of said wiper, and said pickup zone begins at said narrow zone of said electrically conductive layer.

7. An electric potentiometer as defined by claim 6, further wherein said wiper further includes portions and said increasing width (B1) of said pickup zone is selected such that said portions of said wiper which touch said pickup zone when said wiper is in its position adjacent to said narrow zone of said electrically conductive layer, do not touch said electrically nonconductive layer upon a deflection of the wiper along said center line.

* * * * *